United States Patent
Sanduleanu et al.

(10) Patent No.: US 8,994,456 B2
(45) Date of Patent: Mar. 31, 2015

(54) MULTI-STAGE AMPLIFIER USING TUNABLE TRANSMISSION LINES AND FREQUENCY RESPONSE CALIBRATION OF SAME

(75) Inventors: Mihai A. Sanduleanu, Yorktown Heights, NY (US); Alberto Valdes Garcia, Hartsdale, NY (US); David Goren, Nesher (IL); Shlomo Shlafman, Haifa (IL); Danny Elad, Moshav Liman (IL)

(73) Assignee: International Business Machines Corporation, Armonk, NY (US)

( * ) Notice: Subject to any disclaimer, the term of this patent is extended or adjusted under 35 U.S.C. 154(b) by 17 days.

(21) Appl. No.: 13/361,001

(22) Filed: Jan. 30, 2012

(65) Prior Publication Data

US 2013/0194042 A1    Aug. 1, 2013

(51) Int. Cl.
| | |
|---|---|
| H03F 3/191 | (2006.01) |
| H03F 1/22 | (2006.01) |
| H03F 1/56 | (2006.01) |
| H03F 3/195 | (2006.01) |
| H03F 3/60 | (2006.01) |

(52) U.S. Cl.
CPC ............... *H03F 1/223* (2013.01); *H03F 1/565* (2013.01); *H03F 3/195* (2013.01); *H03F 3/601* (2013.01); *H03F 2200/105* (2013.01); *H03F 2200/222* (2013.01); *H03F 2200/255* (2013.01); *H03F 2200/294* (2013.01); *H03F 2200/387* (2013.01); *H03F 2200/405* (2013.01); *H03F 2200/408* (2013.01); *H03F 2200/423* (2013.01); *H03F 2200/555* (2013.01)
USPC .......................................... 330/305; 330/310

(58) Field of Classification Search
USPC ............................ 330/98, 150, 305, 310, 302
See application file for complete search history.

(56) References Cited

U.S. PATENT DOCUMENTS

| | | | | |
|---|---|---|---|---|
| 5,715,529 | A * | 2/1998 | Kianush et al. ............... | 455/266 |
| 5,977,834 | A * | 11/1999 | Davis et al. .................. | 330/302 |
| 7,567,129 | B2 * | 7/2009 | Rohani et al. ................ | 330/305 |
| 7,714,665 | B2 | 5/2010 | Waheed et al. ................ | 331/16 |
| 7,948,324 | B2 * | 5/2011 | Buer et al. .................... | 330/310 |

(Continued)

OTHER PUBLICATIONS

Golio et al., "A Variable Impedance Transmission Line or Inductor for MMIC Applications", Motorola TDB (1992).

(Continued)

*Primary Examiner* — Khanh V Nguyen
(74) *Attorney, Agent, or Firm* — Ryan, Mason & Lewis, LLP

(57) ABSTRACT

A multi-stage amplifier is provided that uses tunable transmission lines, as well as a calibration method for the multi-stage amplifiers. A multi-stage amplifier, comprises a plurality of tunable amplification stages, wherein each of the tunable amplification stages comprises a tunable resonator based on a transmission line having a tunable element. The tunable elements may vary a capacitance or an inductance to tune a frequency of an applied signal. A calibration method is provided for a multi-stage amplifier having a plurality of transmission lines, an input stage and an output stage. The multi-stage amplifier is calibrated by generating a signal to determine a frequency for a substantially maximum power; generating an error signal by comparing the frequency for the substantially maximum power with a desired frequency; varying a digital control code applied to each of the tunable transmission lines, input stage and output stage until the error signal satisfies predefined criteria.

24 Claims, 9 Drawing Sheets

(56) References Cited

U.S. PATENT DOCUMENTS

| | | | |
|---|---|---|---|
| 8,022,766 B2* | 9/2011 | Dupuis et al. | 330/285 |
| 8,319,549 B2* | 11/2012 | Sengupta et al. | 330/305 |
| 2008/0297414 A1* | 12/2008 | Krishnaswamy et al. | 342/368 |
| 2009/0096533 A1 | 4/2009 | Paul et al. | 330/305 |
| 2009/0115525 A1 | 5/2009 | Yim et al. | 330/277 |
| 2009/0175378 A1 | 7/2009 | Staszewski et al. | 375/295 |
| 2010/0315181 A1 | 12/2010 | Mina et al. | |

OTHER PUBLICATIONS

Seongku et al., "A Wideband CMOS LNA with Varactor Tuned Input Matching for WLAN/WiMAX Applications", SoC Design Conference, pp. 108-111 (2009).

Fu et al., "A Tunable Matching Network for Power Amplifier Efficiency Enhancement and Distortion Reduction", Microwave Sympsm Digest, IEEE MTT-S Intl Pub. pp. 1151-1154 (2009).

Nemati et al., "Design of Varactor-Based Tunable Matching Networks for Dynamic Load Modulation of High Power Amplifiers", Microwave Theory and Techniques, IEEE v. 57, pp. 1115-1118, (2009).

Sudow et al., "SiC Varactors for Dynamic Load Modulation of High Power Amplifiers", Electron Device Letters, IEEE, vol. 29, Issue 7, pp. 728-730 (2008).

Shlomo et al., "Structure and Modeling of Variable Transmission Lines", U.S. Appl. No. 13/251,256, filed Oct. 2, 2011.

"On-Chip Tunable Transmission Lines, Methods of Manufacture and Design Structures", U.S. Appl. No. 12/911,327, filed Oct. 25, 2010.

* cited by examiner

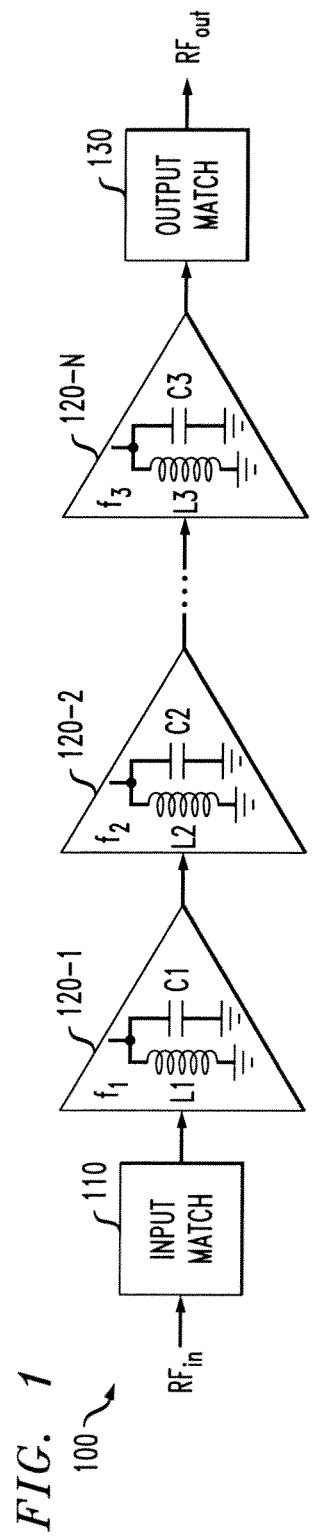
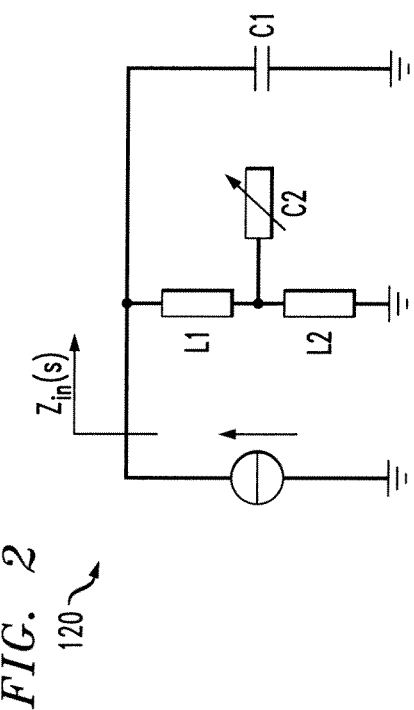
FIG. 1
FIG. 2

1. SWEEP RF FREQUENCY AND FIND THE FREQUENCY FOR MAXIMUM POWER ($f_{max}$) USING THE ALGORITHM 900 DESCRIBED IN FIG. 9;
2. COMPARE FREQUENCY $f_{max}$ WITH THE DESIRED FREQUENCY $f_{required}$ AND GENERATE AN ERROR SIGNAL $\Delta f = |f_{max} - f_{required}|$.
3. GENERATE A DIGITAL CODE FOR CONTROLLING THE VARIABLE TRANSMISSION LINES 720 IN THE RESONATOR STAGE.
4. REPEAT STEPS 1, 2 AND 3 UNTIL $\Delta f$ IS BELOW A PREDEFINED THRESHOLD SPECIFIED BY DESIRED FREQUENCY ACCURACY.
5. CHANGE INPUT MATCHING AND REPEAT STEPS 1, 2 AND 3 (THIS TIME CONTROLLING ONLY THE CODE FOR THE INPUT TRANSMISSION LINE 710).
6. CHANGE OUTPUT MATCHING AND REPEAT 1, 2 AND 3 (THIS TIME CONTROLLING ONLY THE CODE FOR THE OUTPUT TRANSMISSION LINE 730).

MULTI-STAGE AMPLIFIER USING TUNABLE TRANSMISSION LINES AND FREQUENCY RESPONSE CALIBRATION OF SAME

STATEMENT OF GOVERNMENT RIGHTS

This invention was made with Government support under Contract No.: FA8650-09-C-7924 (Defense Advanced Research Projects Agency (DARPA)). The Government has certain rights in this invention.

FIELD OF THE INVENTION

The present invention relates generally to amplifiers capable of operating at millimeter-wave (mm-wave) frequencies, and more specifically to multi-state amplifiers based on tunable transmission lines.

BACKGROUND

Low noise amplifiers (LNAs) are the building blocks of any communication system. For example, a low-noise amplifier is typically the first active circuit after the antenna in a radio transceiver, and is thus a critical building block for a radio transceiver. To increase receiver sensitivity and reduce the amount of noise contributed by subsequent stages, the LNA is required to have a moderate gain and a low-noise figure. The LNA is required to be matched to the characteristic impedance of the system (usually 50 ohms) at its input and output. In addition, to operate at millimeter-wave (mm-wave) frequencies (30 GHz and higher), such systems must often be capable of transmitting, receiving and manipulating mm-wave signals.

As MOSFET miniaturization reaches deep submicron sizes (0.5 mm and below), mm-wave LNAs and other amplifiers require multi-stage designs to achieve the necessary gain. Due to process variations, model inaccuracies and the extra parasitics related to wiring, however, the various stages will typically operate at different frequencies. As a result, the total gain decreases and the bandwidth of the amplifier will change. In addition, the frequency response of the amplifier ($S_{21}$) exhibits a frequency shift and the input/output matching will be impaired. For lower frequencies, such as microwave frequencies, tunable varactors can be used. A varactor has a capacitance that varies with the applied voltage. At mm-wave frequencies, however, varactors have a low quality factor. Therefore, varactors cannot be used at mm-wave frequencies for varying the capacitance.

U.S. patent application Ser. No. 13/251256, filed 2 Oct. 2011, entitled "Structure and Modeling of Variable Transmission Lines," discloses a tunable transmission line that is digitally tuned to compensate for process variations in both the active and passive devices of the RF design. A disclosed variable transmission line comprises a semiconductor substrate, a signal line, a first plurality of capacitor ports below the signal line, where each capacitor port is operative to be connected to either ground or a floating potential, a bottom ground plane and one or more side shield wires.

A need remains for a digitally controlled resonator for resonant amplifiers based on a tunable passive component. A further need exists for a multi-stage digitally controlled resonator for resonant amplifiers where the amplification stages are identical and working at the same resonant frequency that can be controlled in a digital manner. Yet another need exists for a method to employ the resonator in the digital calibration of the frequency response of the amplifiers.

SUMMARY

Generally, a multi-stage amplifier is provided that uses tunable transmission lines. A frequency response calibration technique is also provided. According to one aspect of the invention, a multi-stage amplifier, comprises a plurality of tunable amplification stages, wherein each of the tunable amplification stages comprises a tunable resonator based on a transmission line having a tunable element. The tunable elements may vary a capacitance or an inductance to tune a frequency of an applied signal.

According to another aspect of the invention, a calibration method is provided for a multi-stage amplifier having a plurality of transmission lines, an input stage and an output stage. The multi-stage amplifier is calibrated by generating a signal to determine a frequency for a substantially maximum power; generating an error signal by comparing the frequency for the substantially maximum power with a desired frequency; varying a digital control code applied to the tunable transmission lines until the error signal satisfies a first predefined criteria; varying a digital control code applied to the input stage until the error signal satisfies a second predefined criteria; and varying a digital control code applied to the output stage until the error signal satisfies a third predefined criteria.

A more complete understanding of the present invention, as well as further features and advantages of the present invention, will be obtained by reference to the following detailed description and drawings.

BRIEF DESCRIPTION OF THE DRAWINGS

FIG. 1 illustrates a multi-stage low noise amplifier incorporating features of the present invention;

FIG. 2 illustrates an exemplary model of a tunable amplification stage that may be employed by the present invention;

FIG. 8 is exemplary pseudo code for a digital self-calibration process for the exemplary multi-stage low noise amplifier;

DETAILED DESCRIPTION OF PREFERRED EMBODIMENTS

Figure 3:
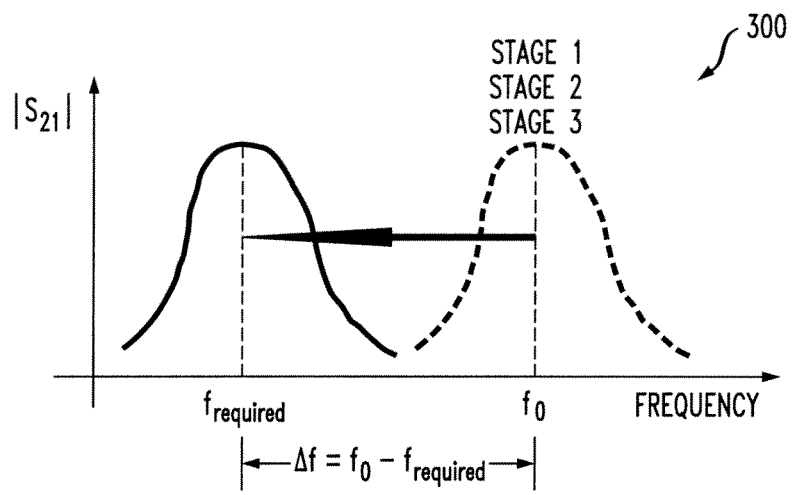
FIG. 3 illustrates a frequency response for the three exemplary tunable transmission lines of FIG. 1, for an exemplary small band design.

The present invention provides a digitally controlled resonator for resonant amplifiers based on a tunable passive component, such as a tunable capacitor or inductor. According to one aspect of the invention, a multi-stage digitally controlled resonator for resonant amplifiers employs tunable amplification stages that can optionally be tuned to work at substantially the same resonant frequency. According to another aspect of the invention, the disclosed resonator is employed to calibrate the frequency response of the amplifiers.

FIG. 1 illustrates a multi-stage low noise amplifier 100 incorporating features of the present invention. As shown in FIG. 1, the multi-stage low noise amplifier 100 comprises a plurality of tunable amplification stages 120-1 through 120-N, discussed further below, for example, in conjunction with FIG. 2. In the exemplary embodiment of FIG. 1, N is equal to 3. As discussed hereinafter, each tunable amplification stage 120 comprises a tunable passive component, such as a tunable capacitor or inductor, that can optionally be tuned to work at substantially the same resonant frequency as each other. The stages are substantially identical. In addition, the multi-stage low noise amplifier 100 comprises an input stage 110 and an output stage 130 that are substantially matched. As shown in FIG. 1 and discussed more fully below in conjunction with FIGS. 3 and 4, a given tunable amplification stage 120-$i$ has a corresponding tunable resonant frequency $f_i$.

FIG. 2 illustrates an exemplary model of a tunable amplification resonator stage 120 that may be employed by the present invention. As shown in FIG. 2, the exemplary tunable amplification resonator stage 120 comprises two transmission lines L1 and L2 together with a tunable transmission line-stub C2. The transmission lines L1 and L2 may be implemented, for example, using microstrip or coplanar waveguides. (See, e.g., Yanyu Jin et al., "A Wideband Millimeter-Wave Power Amplifier With 20 dB Linear Power Gain and +8 dBm Maximum Saturated Output Power," IEEE J. of Solid-States Circuits, vol. 43, pp. 1553-1562, 2008, incorporated by reference herein) together with a tunable transmission line stub C2. A parallel capacitance C1 comprises the active device output capacitance and the wiring capacitance, in a known manner.

The tunable transmission line stub C2 may be a tunable capacitor with a controllable resonance frequency, such as those described in U.S. patent application Ser. No. 13/251256, filed 2 Oct. 2011, entitled "Structure and Modeling of Variable Transmission Lines," incorporated by reference herein. In an alternate implementation, the tunable resonator can be realized with elements L1 and L2 operating (both or only L1/L2) as a tunable inductor with a controllable resonance frequency, such as those described in U.S. patent application Ser. No. 12/478,385, filed 4 Jun. 2009, entitled "Vertical Coplanar Waveguide With Tunable Characteristic Impedance, Design Structure and Method of Fabricating the Same," and/or U.S. patent application Ser. No. 12/911,327, filed 25 Oct. 2010, entitled "'On-Chip Tunable Transmission Lines, Methods of Manufacture and Design Structures," each incorporated by reference herein.

The input impedance, $Z_{in}(s)$, of each tunable amplification stage 120 can be expressed as follows:

$$Zin(s) = \frac{sL1\left(1 + \frac{L2}{L1} + s^2 L2C2\right)}{1 + s^2(L1C1 + L2C2 + L2C1) + s^4 L1L2C1C2}$$

FIG. 3 illustrates the frequency response 300 for the three exemplary tunable transmission lines 120 of FIG. 1, for an exemplary small band design. In particular, FIG. 3 illustrates the power gain between the input and output ports of the tunable transmission lines 120 (s parameter $S_{21}$), as a function of frequency. As shown in FIG. 3, for a small band design, it is desired that the three exemplary tunable transmission lines 120 operate at substantially the same required resonant frequency, $f_{required}$. The nominal operating frequency, $f_0$, of each tunable transmission line 120 is adjusted in accordance with one embodiment of the present invention to be aligned to the desired required frequency, $f_{required}$ ($\Delta f = f_0 - f_{required}$). In the small band embodiment, the three stages 120 are substantially identical. Thus, as discussed further below, the digital code applied to each stage 120 can be identical and the frequency shift for each stage 120 is the same. By changing the capacitance of the variable transmission line, the resonance frequency of each resonant stage 120 changes, and the design can be centered back to the required frequency $f_{required}$.

Figure 4:
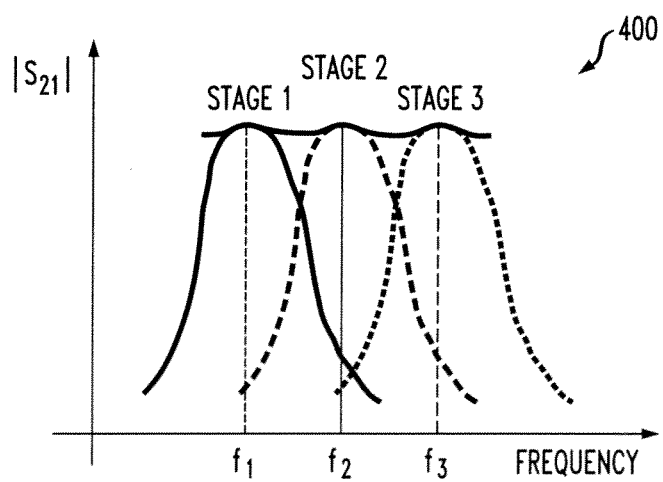
FIG. 4 illustrates a frequency response for the three exemplary tunable transmission lines of FIG. 1, for an exemplary broadband design.

FIG. 4 illustrates the frequency response 400 for the three exemplary tunable transmission lines 120 of FIG. 1, for an exemplary broadband design. In particular, FIG. 4 illustrates the power gain between the input and output ports of the tunable transmission lines 120 (s parameter $S_{21}$), as a function of frequency. As shown in FIG. 4, for a broadband design, it is desired that the three exemplary tunable transmission lines 120 operate at different resonant frequencies, $f_1$ through $f_3$. For the broadband embodiment, additional bandwidth is obtained at the expense of gain. In the broadband embodiment, the resonant frequencies, $f_1$ through $f_3$, of the stages 120 are staggered and working at three different frequencies: $f_1$, $f_2$ and $f_3$. In this case, each stage 120 can be tuned individually at the desired frequency, resulting in a frequency transfer with larger bandwidth and possible ripple in the pass-band, as shown in FIG. 4.

Figure 5:
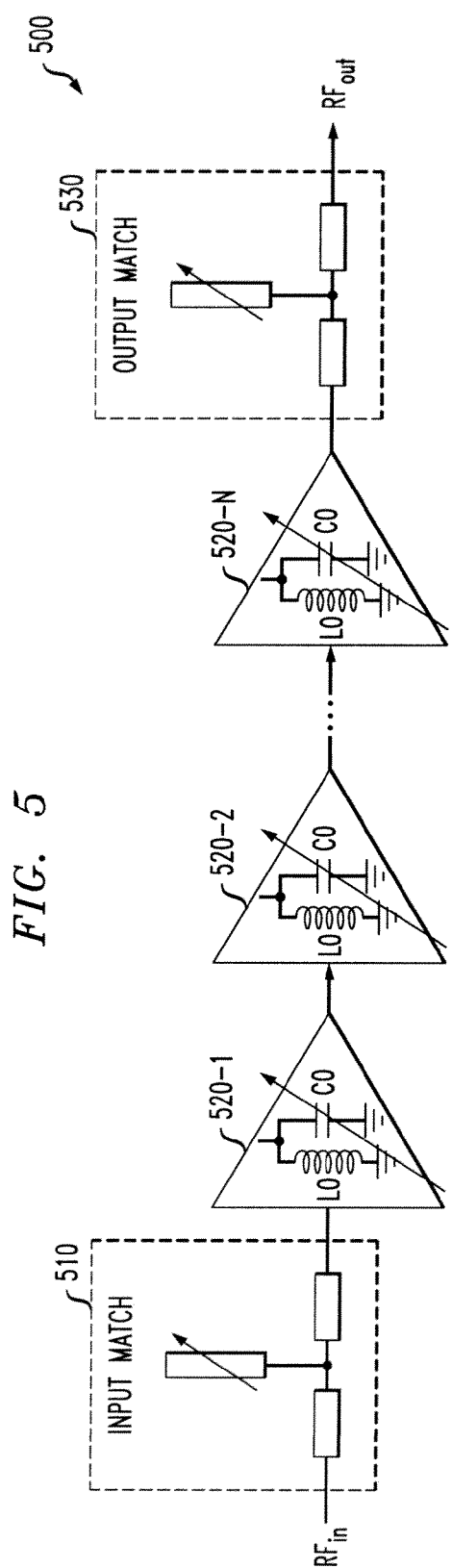
FIG. 5 illustrates an alternate multi-stage low noise amplifier incorporating features of the present invention.

FIG. 5 illustrates an alternate multi-stage low noise amplifier 500 incorporating features of the present invention. As shown in FIG. 5, the multi-stage low noise amplifier 500 comprises a plurality of tunable amplification stages 520-1 through 120-N, in a similar manner to FIG. 1. In addition, the multi-stage low noise amplifier 500 of FIG. 5 employs tunable transmission lines, such as those described above in conjunction with FIG. 2, as the input stage 510 and output stage 530, for input and output matching.

Generally, the input/output matching embodiment of FIG. 5 aims to change the frequency of the tunable transmission lines for the best match to 50 ohms, without altering the gain setting of the amplifier 500. This can be achieved, for example, with a high input/output isolation for the individual stages.

Figure 6:
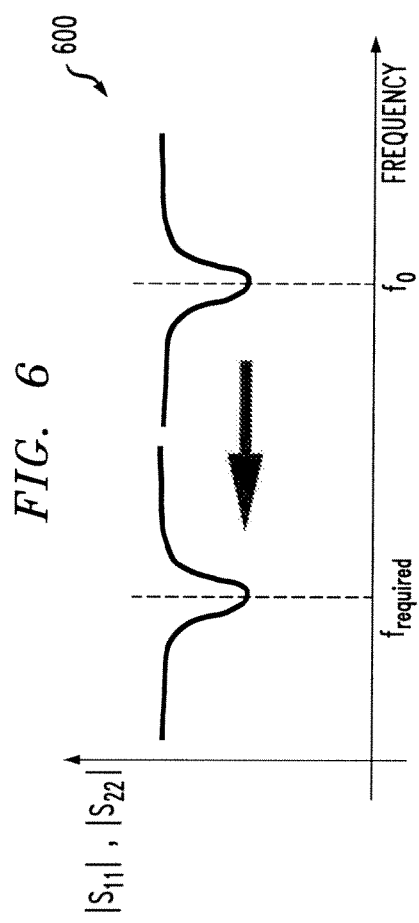
FIG. 6 illustrates the frequency response for the alternate multi-stage low noise amplifier of FIG. 5

FIG. 6 illustrates the frequency response 600 for the alternate multi-stage low noise amplifier 500 of FIG. 5. In particular, FIG. 6 illustrates the input reflection coefficient, $S_{11}$, and output reflection coefficient, $S_{22}$, of the input and output tunable transmission lines 510 and 530, respectively, as a function of frequency. As shown in FIG. 6, for the input/output matching design, it is desired that the exemplary input and output tunable transmission lines 510 and 530 operate at substantially the same required resonant frequency, $f_{required}$. The nominal operating frequency, $f_0$, of each tunable transmission line 510, 530 is adjusted in accordance with one embodiment of the present invention to be aligned to the desired required frequency, $f_{required}$ ($\Delta f = f_0 - f_{required}$). By changing the capacitance of the variable transmission lines 510, 530, the resonance frequency of each transmission line 510, 530 changes, and the design can be centered back to the required frequency $f_{required}$.

Digital Calibration of Multi-Stage Low Noise Amplifier

Figure 7:
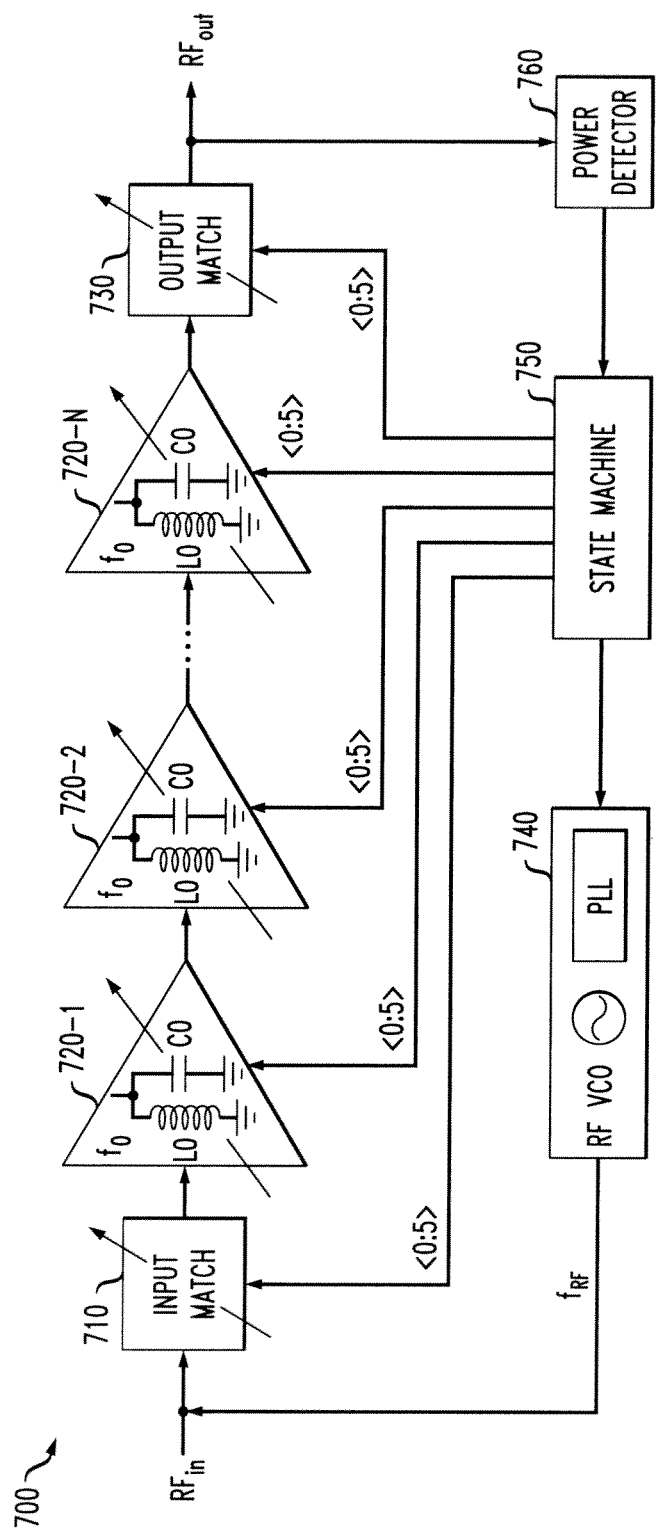
FIG. 7 illustrates an alternate multi-stage low noise amplifier having on-chip digital calibration in accordance with the present invention.

FIG. 7 illustrates an alternate multi-stage low noise amplifier 700 having on-chip digital calibration in accordance with the present invention. As shown in FIG. 7, the multi-stage low noise amplifier 700 comprises a plurality of tunable amplification stages 7-1 through 720-N, in a similar manner to FIG. 1. In addition, the multi-stage low noise amplifier 700 employs tunable transmission lines as the input stage 710 and output stage 730, for input and output matching, in a similar manner to FIG. 5.

In addition, the exemplary multi-stage low noise amplifier 700 comprises a voltage controlled oscillator (VCO) 740, a state machine 750 and a power detector 760. As discussed further below, the VCO 740 can sweep its output frequency and the state machine 750 monitors its frequency to generate an RF signal, $f_{RF}$, that is used during calibration. The state machine 750 is discussed further below in conjunction with FIGS. 8 and 9. The power detector 760 measures the power during calibration at the output of the output matching stage 730. During self calibration, the input/output match 710, 730 and the gain of the tunable transmission lines 720 will be changed by the state machine 740, for example, using six bits of digital control. Generally, the input and output match can be measured on a vector network analyzer (VNA) and the capacitance of the input and output variable transmission line stub is changed for the best match at the required frequency, using external measurement equipment. In the state machine 740, a low frequency analog-to-digital converter (ADC) (e.g., 10-bit successive approximation or SAR) can measure the DC value given by the power detector 750.

FIG. 8 is exemplary pseudo code for a digital self-calibration process 800 for the exemplary multi-stage low noise amplifier 700. As shown in FIG. 8, the digital self-calibration process 800 comprises the steps of:

1. Sweep RF frequency and find the frequency for maximum power ($f_{max}$) using the algorithm 900 described in FIG. 9;

2. Compare frequency $f_{max}$ with the desired frequency $f_{required}$ and generate an error signal $\Delta f=|f_{max}-f_{required}|$.

3. Generate a digital code for controlling the variable transmission lines 720 in the resonator stage.

4. Repeat Steps 1, 2 and 3 until $\Delta f$ is below a predefined threshold specified by desired frequency accuracy.

5. Change input matching and repeat Steps 1, 2 and 3 (this time controlling only the code for the input transmission line 710).

6. Change output matching and repeat 1, 2 and 3 (this time controlling only the code for the output transmission line 730).

Figure 9:
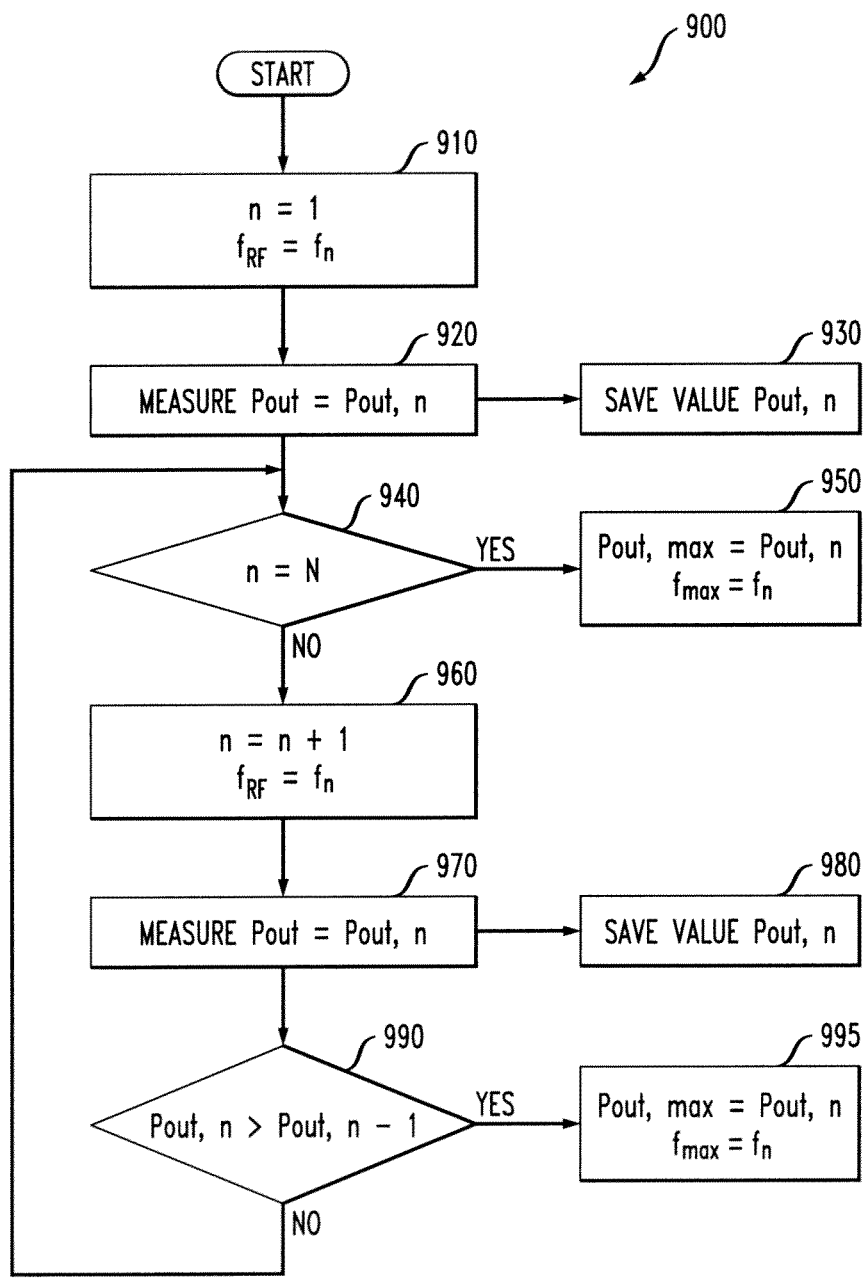
FIG. 9 is a flow chart describing an exemplary implementation of an algorithm for finding the frequency for maximum output power.

FIG. 9 is a flow chart describing an exemplary implementation of an algorithm 900 for finding the frequency for maximum output power. As shown in FIG. 9, a counter, n, and the initial frequency of the RF signal, $f_{RF}$, are initialized during step 910. The power is measured during step 920, and saved during step 930. A test is performed during step 940, to determine if the counter has reached the maximum value, N. If it is determined during step 940 that the counter has reached the maximum value, N, then the maximum output power is determined during step 950. If, however, it is determined during step 940 that counter has not reached the maximum value, N, then the counter is incremented at step 960, the power re-measured at step 970 and saved at step 980.

A further test is performed during step 990, to determine if the current power exceeds the prior power measurement. If so, the value is stored during step 995.

Figure 10:
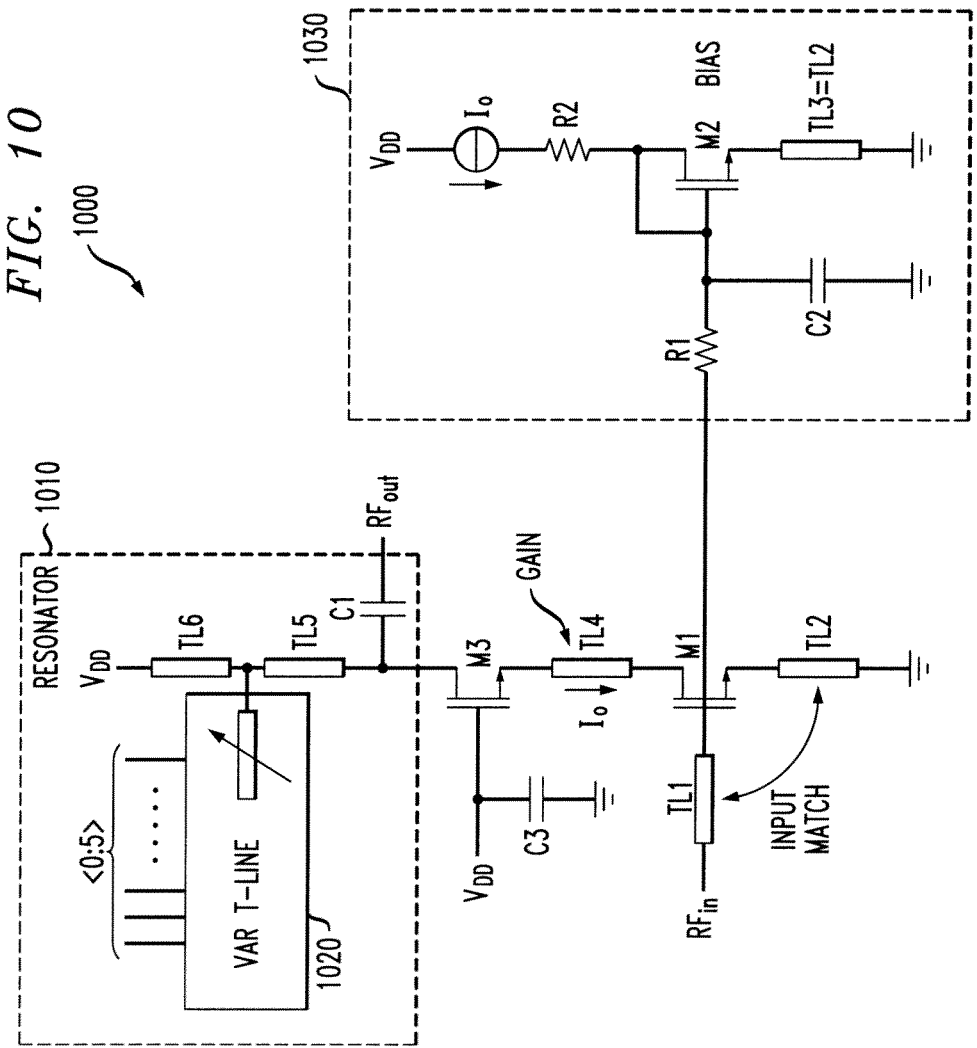
FIG. 10 illustrates a single stage variable transmission line low noise amplifier in accordance with the present invention.

FIG. 10 illustrates a single stage variable transmission line low noise amplifier 1000 in accordance with the present invention. As shown in FIG. 10, the variable transmission line LNA 1000 is based on a cascode amplifier with the transmission lines TL1 and TL2 for the input match. A tunable transmission line TL4 between the common-source and common-gate transistor increases the gain at the resonance frequency by resonating with the gate-source capacitance of M3 and the stray capacitance at the drain of M1. The gate of M3 is at $V_{DD}$ (RF ground) and its drain is connected to the resonator 1010.

The resonator 1010 consists of two transmission lines TL5 and TL6 with a variable transmission line stub 1020 connected in the middle of transmission lines TL5 and TL6. As shown in FIG. 10, a 6-bit control vector can be applied to the resonator 1010 to change the capacitance of the stub 1020. The code can be, for example, a thermometer code (switching equal capacitance when incrementing the code by one) with the following values:

{000000, 000001, 000011, 000111, 001111, 011111, 111111}.

The cascode stage 1030 is biased at constant current L using a current source from the transistor M2. For best matching, transistor M2 has a transmission line TL3 substantially identical to transmission line TL2 in its source. A resistor R1 works as a choke for the input RF signal and C2 provides low-pass filtering for the RF signal coming from the RF path, preventing RF pollution through supply lines. The same capacitor C2 together with resistor R2 provides low-pass filtering for any RF signal/noise coming from the current source L.

Figure 11:
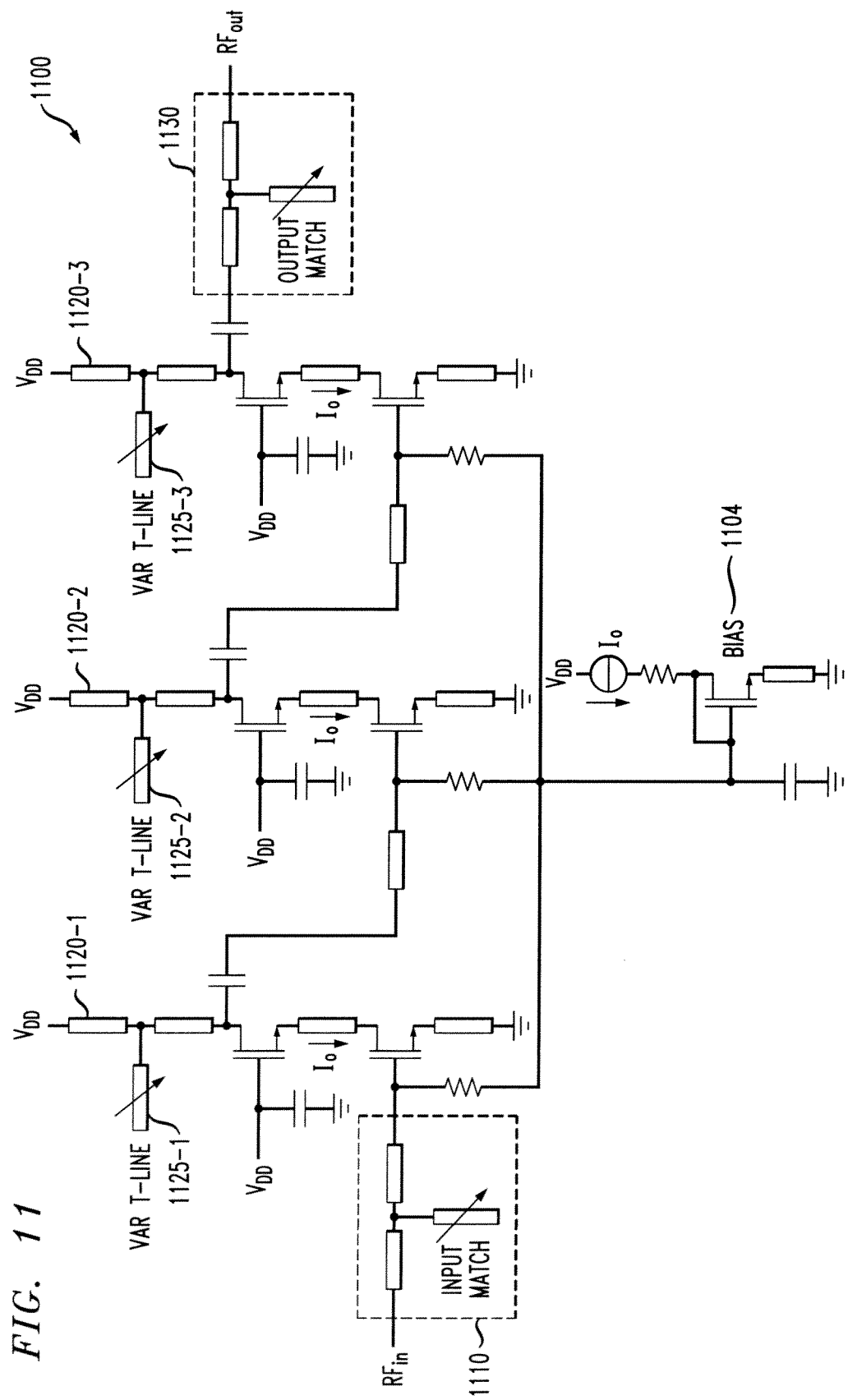
FIG. 11 illustrates a three stage variable transmission line low noise amplifier in accordance with the present invention.

FIG. 11 illustrates a three stage variable transmission line low noise amplifier 1100 in accordance with the present invention. As shown in FIG. 11, the exemplary variable transmission line LNA stage 1100 comprises three stages 1120-1 through 1120-3 each comprising a variable transmission line 1125-1 through 1125-3, respectively. In addition, the exemplary variable transmission line LNA stage 1100 employs variable transmission lines in an input stage 1110 and an output stage 1130. Finally, the exemplary variable transmission line LNA stage 1100 employs a common bias circuit 1140 for all three stages 1120.

Figure 12:
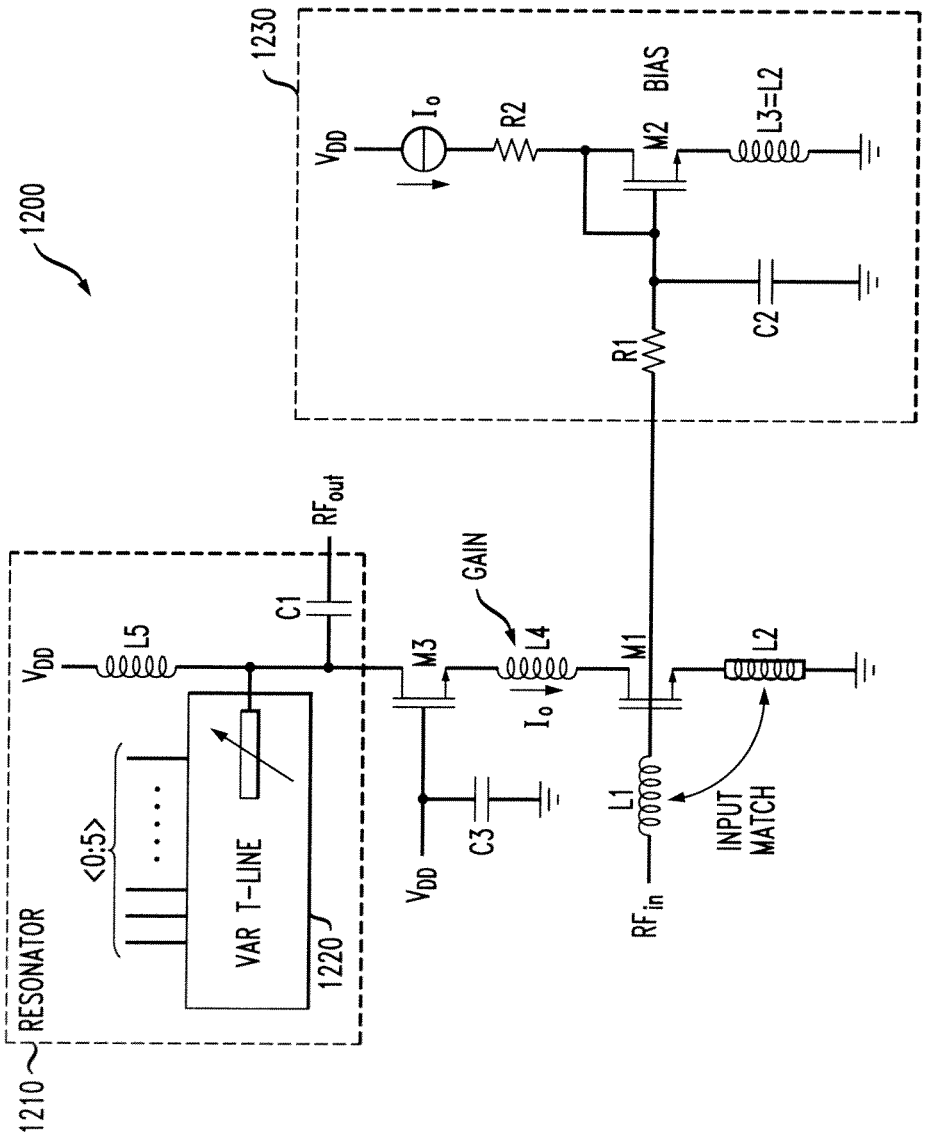
FIG. 12 illustrates an alternate single stage hybrid variable transmission line low noise amplifier 1200 in accordance with the present invention.

FIG. 12 illustrates an alternate single stage hybrid variable transmission line low noise amplifier 1200 in accordance with the present invention. As shown in FIG. 12, the hybrid variable transmission line LNA 1200 is based on a cascode amplifier with the transmission lines of FIG. 10 replaced with inductors. Inductors L1 and L2 provide the input match. An inductor L4 between the common-source and common-gate transistor increases the gain at the resonance frequency by resonating with the gate-source capacitance of M3 and the stray capacitance at the drain of M1. The gate of M3 is at $V_{DD}$ (RF ground) and its drain is connected to the resonator 1210.

The resonator 1210 consists of a variable transmission line 1220 connected at the drain of M3 and an inductor L5. As shown in FIG. 12, a 6-bit control vector can be applied to the resonator 1210 to change the capacitance of the stub. The code can be, for example, a thermometer code (switching equal capacitance when incrementing the code by one) with the following values:

{000000, 000001, 000011, 000111, 001111, 011111, 1111111}.

The cascode stage 1230 is biased at constant current $I_o$ using a current source from the transistor M2. For best matching, transistor M2 has an inductor L3 substantially identical to inductor L2 in its source. A resistor R1 works as a choke for the input RF signal and C2 provides low-pass filtering for the RF signal coming from the RF path, preventing RF pollution through supply lines. The same capacitor C2 together with resistor R2 provides low-pass filtering for any RF signal/noise coming from the current source $I_o$.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

Exemplary System and Article of Manufacture Details

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

One or more embodiments of the invention, or elements thereof, can be implemented in the form of an apparatus including a memory and at least one processor that is coupled to the memory and operative to perform exemplary method steps. One or more embodiments can make use of software running on a general purpose computer or workstation. Such an implementation might employ, for example, a processor, a memory, and an input/output interface formed, for example, by a display and a keyboard. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices, such as a state machine, to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Method steps described herein may be tied, for example, to a general purpose computer programmed to carry out such steps, or to hardware for carrying out such steps, as described herein. Further, method steps described herein, including, for example, obtaining data streams and encoding the streams, may also be tied to physical sensors, such as cameras or microphones, from whence the data streams are obtained.

In any case, it should be understood that the components illustrated herein may be implemented in various forms of hardware, software, or combinations thereof; for example, application specific integrated circuit(s) (ASICS), state machines, functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A multi-stage amplifier, comprising:
a plurality of tunable amplification stages, wherein each of said tunable amplification stages comprises a tunable resonator comprising a transmission line having a tunable element, wherein one or more of said tunable elements vary an inductance to tune a frequency.

2. The multi-stage amplifier of claim 1, wherein one or more of said tunable elements further vary a capacitance to tune a frequency.

3. The multi-stage amplifier of claim 1, wherein each of said transmission lines are substantially identical and operate at a substantially similar frequency.

4. The multi-stage amplifier of claim 3, wherein an operating frequency of each of said transmission lines is adjusted to be aligned to a desired required frequency.

5. The multi-stage amplifier of claim 1, wherein each of said transmission lines operate at a different frequency to provide a broadband design.

6. The multi-stage amplifier of claim 1, wherein one or more of said transmission lines tune a frequency based on a digital control word that is applied to said transmission lines.

7. The multi-stage amplifier of claim 1, further comprising an input matching circuit and an output stage matched to a next stage.

8. The multi-stage amplifier of claim 7, wherein said input matching circuit and said output stage are tunable to obtain a matching at an operating frequency.

9. The multi-stage amplifier of claim 1, wherein said multi-stage amplifier comprises a low noise amplifier.

10. The multi-stage amplifier of claim 1, wherein said multi-stage amplifier comprises a power amplifier.

11. The multi-stage amplifier of claim 1, wherein said multi-stage amplifier operates at a millimeter wave frequency.

12. The multi-stage amplifier of claim 1, wherein said multi-stage amplifier is integrated on a chip.

13. The multi-stage amplifier of claim 1, wherein a resonant frequency of said multi-stage amplifier is varied by varying one or more of said inductance and a capacitance of at least one of said transmission lines.

14. The multi-stage amplifier of claim 1, further comprising an on-chip oscillator for generating a signal having a desired frequency and an on-chip power detector for measuring said signal at an output of said multi-stage amplifier.

15. The multi-stage amplifier of claim 14, further comprising a state machine for executing a calibration process.

16. The multi-stage amplifier of claim 15, wherein said calibration process adjusts one or more of a matching of an input stage and an output stage and a gain of said transmission lines having said tunable element.

17. The multi-stage amplifier of claim 1, wherein at least one of said transmission lines comprises an inductor.

18. A calibration method for a multi-stage amplifier having a plurality of transmission lines, an input stage and an output stage, comprising:
generating a signal to determine a frequency for a substantially maximum power;
generating an error signal by comparing said frequency for said substantially maximum power with a desired frequency;
varying a digital control code applied to said transmission lines until said error signal satisfies a first predefined criteria;
varying a digital control code applied to said input stage until said error signal satisfies a second predefined criteria; and
varying a digital control code applied to said output stage until said error signal satisfies a third predefined criteria.

19. The calibration method of claim 18, wherein said signal to determine a frequency is generated by an on-chip oscillator.

20. The calibration method of claim 18, wherein said method is performed by an on-chip state machine.

21. The calibration method of claim 18, wherein at least one of said transmission lines comprises an inductor.

22. A method for amplifying a signal, comprising:
applying said signal to a multi-stage amplifier, wherein said multi-stage amplifier comprises a plurality of tunable amplification stages, wherein each of said tunable amplification stages comprises a tunable resonator comprising a transmission line having a tunable element; and
varying an inductance of at least one of said tunable elements to vary a frequency of said signal.

23. The method of claim 22, wherein said multi-stage amplifier further comprises an input matching circuit and an output stage matched to a next stage.

24. The method of claim 22, wherein said signal has a millimeter wave frequency.

* * * * *